United States Patent [19]
Fender et al.

[11] 3,973,220
[45] Aug. 3, 1976

[54] OSCILLATOR AMPLITUDE REGULATING SYSTEM

[75] Inventors: Ferdinand G. Fender, Glenview; Tore S. Karlsson, Chicago, both of Ill.

[73] Assignee: Ni-Tec, Inc., Skokie, Ill.

[22] Filed: June 2, 1975

[21] Appl. No.: 582,913

[52] U.S. Cl............................ 331/109; 331/117 R; 331/183
[51] Int. Cl.²........................ H03B 3/02; H03B 5/12
[58] Field of Search................ 331/109, 117 R, 182, 331/183

[56] References Cited
UNITED STATES PATENTS

| | | | |
|---|---|---|---|
| 3,284,724 | 11/1966 | Marlow | 331/109 |
| 3,293,568 | 12/1966 | Ganter et al. | 331/109 |
| 3,701,041 | 10/1972 | Adler et al. | 331/109 X |

Primary Examiner—Siegfried H. Grimm
Attorney, Agent, or Firm—Richard O. Gray, Jr.

[57] ABSTRACT

The disclosure relates to an amplitude control for controlling the peak amplitude of a transistor oscillator output alternating voltage and to an improved regulating system which includes an oscillator associated with the amplitude control for converting a DC voltage to an alternating output voltage having a regulated or controlled peak amplitude. The amplitude control comprises a control voltage generating means for providing a control voltage and clipping means coupled between the base of the oscillator transistor and the control voltage generator for varying the bias of the oscillator transistor responsive to the control voltage to thereby control the peak amplitude of the oscillator alternating output voltage.

5 Claims, 2 Drawing Figures

OSCILLATOR AMPLITUDE REGULATING SYSTEM

BACKGROUND OF THE INVENTION

The present invention is generally directed to an amplitude control for controlling the peak amplitude of an oscillator output alternating voltage and more particularly to an improved regulating system of the type which converts a DC voltage to an alternating voltage of controlled peak amplitude.

Regulating systems for converting a DC voltage to an alternating output voltage of constant peak amplitude are well-known in the art. Such systems generally include an oscillator which converts the DC voltage to an alternating voltage. Regulation is obtained by utilizing a series pass transistor coupled between the DC voltage source and the collector of the oscillator transistor to control the amount of current available to the oscillator. In doing so, the peak amplitude of the alternating output voltage may be controlled.

Regulating systems of this type find considerable application in devices such as image intensifiers where a high constant voltage at low current is required. In such devices, a voltage multiplier multiplies and rectifies the oscillator regulated alternating output voltage, which may be of the order 500 volts peak-to-peak amplitude, to a DC voltage in the order of 8,000 DC. Because image intensifiers and other similar devices must be of small size, the DC voltage to be converted is usually supplied by a small battery delivering a DC voltage of as low as 2 volts.

Prior art systems of this type have been generally satisfactory because of their small size and regulating ability. However, prior art systems experience difficulty when operation at low temperatures and at low values of DC battery supply voltage is required. At low temperatures amplitude stability of prior art systems begins to fail because the forward voltage drop of the series pass transistor adds to the oscillator characteristic which also tends to increase in forward drop due to the decreased conduction of the oscillator transistor. Also, because the oscillator draws current in pulses over only small portions of its cycle, the pass transistor is required to supply relatively high peak currents with a small forward voltage drop.

It is therefore a general object of the present invention to provide a new and improved amplitude control for an oscillator circuit which controls the peak amplitude of the oscillator alternating output voltage.

It is another object of the present invention to provide a new and improved regulating system of the type which converts a DC voltage to an alternating voltage of regulated peak amplitude.

It is a still more particular object of the present invention to provide a new and improved regulating system for converting a DC voltage to an alternating voltage of constant peak amplitude having regulating characteristics which are substantially more stable over wide temperature ranges than heretofore obtainable with systems of the prior art.

SUMMARY OF THE INVENTION

The invention provides in an oscillator circuit of the type which provides an alternating voltage output and includes a transistor having a base, an emitter and a collector, wherein the collector is coupled to a DC voltage source and wherein the alternating voltage output is at the emitter, a new and improved amplitude control for controlling the peak amplitude of the oscillator alternating output voltage. The amplitude control comprises control voltage generating means for providing a control voltage and clipping means coupled between the base of the oscillator transistor and the control voltage generating means for varying the bias on the base of the oscillator transistor responsive to the control voltage generating means to thereby control the peak amplitude of the oscillator output.

The present invention also provides a regulating system for converting a DC voltage to an alternating voltage of constant peak amplitude which comprises an oscillator including a transistor having a base and coupled to the DC voltage for converting the DC voltage to an alternating output voltage, control voltage means responsive to the peak amplitude of the alternating output voltage for providing a control voltage having a magnitude which is inversely related to the peak amplitude of the alternating output voltage, and clipping means coupled between the base and the control voltage means for controlling the bias of the transistor to thereby cause the oscillator alternating output voltage to vary in direct relation to the control voltage. As a result, when the peak amplitude of the output voltage increases, the control voltage decreases causing the clipping means to bias the transistor for decreased output voltage and when the peak amplitude of the output voltage decreases, the control voltage increases causing the clipping means to bias the transistor for increased output voltage to thereby render the peak amplitude of the oscillator alternating output voltage constant.

BRIEF DESCRIPTION OF THE DRAWINGS

The invention, together with the objects and advantages thereof, may best be understood by reference to the following description taken in conjunction with the accompanying drawings, and in the several figures of which like reference numerals identify like elements, and in which.

DESCRIPTION OF THE PREFERRED EMBODIMENT

Figure 1:
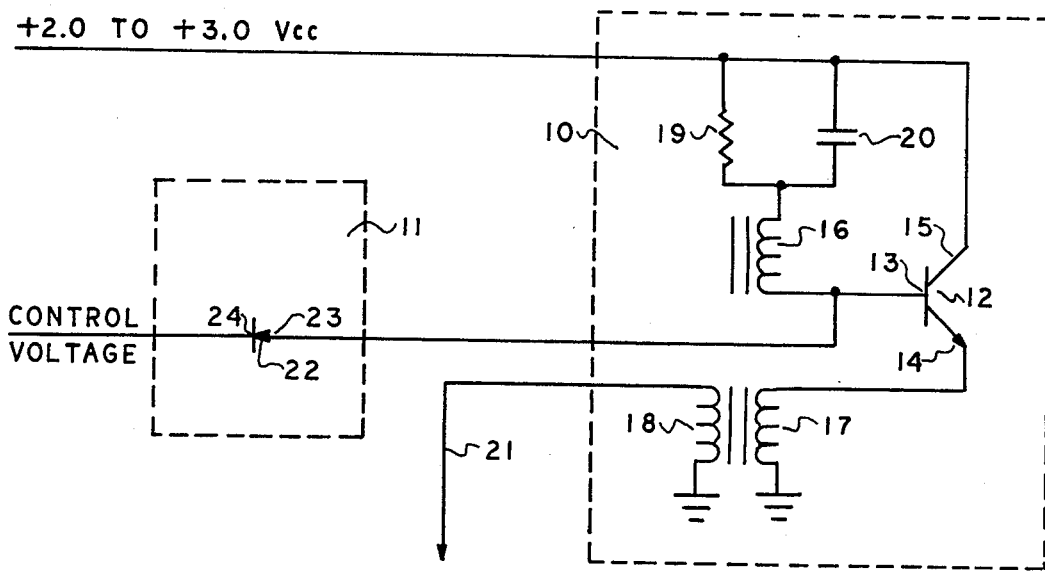
FIG. 1 is a simplified schematic circuit diagram of an oscillator circuit embodying the amplitude control of the present invention.

Referring now to FIG. 1, the oscillator and amplitude control thereshown comprises an oscillator 10 and clipping means 11. Oscillator 10 is of a Hartly derived type and includes NPN transistor 12, a transformer having windings 16, 17 and 18, resistor 19 and capacitor 20. Transformer winding 16 is coupled to base 13 of transistor 12 and to the junction of resistor 19 and capacitor 20. Resistor 19 and capacitor 20 are in turn coupled to the +2 volt battery supply voltage. Winding 17 is coupled between emitter 14 of transistor 12 and ground and also is inductively coupled to transformer winding 16. The transformer comprising windings 16, 17 and 18 is preferably constructed using a ferrite core with windings 16 and 17 designed to assure oscillation in a manner well-known in the art. Winding 18 which is inductively coupled to winding 17 provides the alternating voltage output from oscillator 10 on line 21.

As previously explained, oscillators of this nature are generally followed by a voltage multiplier and rectifier which present a load impedance which has a capacitive component. The oscillation frequency in large part is determined by the capacitive component of the multiplier load impedance, the winding inductances of windings 16 and 17 and stray capacitance.

Clipping means 11 comprises a diode 22 which has an anode 23 and a cathode 24. Anode 23 is coupled to base 13 of transistor 12 and cathode 24 is coupled to a control voltage generating means (not shown). A suitable control voltage generating means will be described subsequently with reference to FIG. 2. Suffice it to say that the control voltage generating means provides a positive control voltage which is controllably variable.

In effecting control of the peak amplitude of the alternating output voltage of oscillator 10, when the control voltage is near or at the supply voltage, the diode 22 or clipping means has little or no effect upon the oscillator output and maximum output is obtained which is limited only by the amount of supply voltage, the winding turn ratios of the transformer and the natural non-linearities of transistor 12. As the control voltage is decreased towards ground potential, diode 22 conducts on positive going portions of the base drive at base 13 produced by winding 16. This introduces an additional non-linearity in the oscillator and reduces the oscillation amplitude nearly in linear proportion to the value of the control voltage above ground potential. At the far extreme, as the control voltage is reduced to nearly ground potential, the peak amplitude of the oscillator alternating output voltage may be reduced to nearly zero.

As in the case of prior art series pass transistors, the amplitude control diode 22 draws currents in pulses. However, because the base of transistor 12 is being controlled instead of the collector, the peak currents are reduced approximately by the value of Beta of transistor 12. In addition, the peak currents required through diode 22 do not vary significantly with output amplitude and, in fact, are smaller at maximum oscillator output. This is just the opposite of the case for prior art systems. Because of the foregoing, together with the nearly linear control of the oscillator output, design of the control loop for a regulating system in which the oscillator and amplitude control of FIG. 1 is incorporated is made much easier.

Substantially improved output amplitude stability over extreme temperature ranges is provided because at low temperatures, the output of the oscillator alone tends to decrease due to the increase in conduction or junction drop through transistor 12. However, the forward drop through diode 22 also increases, thus, reducing the clipping action of diode 22 which tends to increase the peak amplitude of the oscillator alternating output voltage. The conjoint action of these two effects largely cancel over a fairly wide temperature range thus rendering the present invention substantially more stable than prior art circuits.

Figure 2:
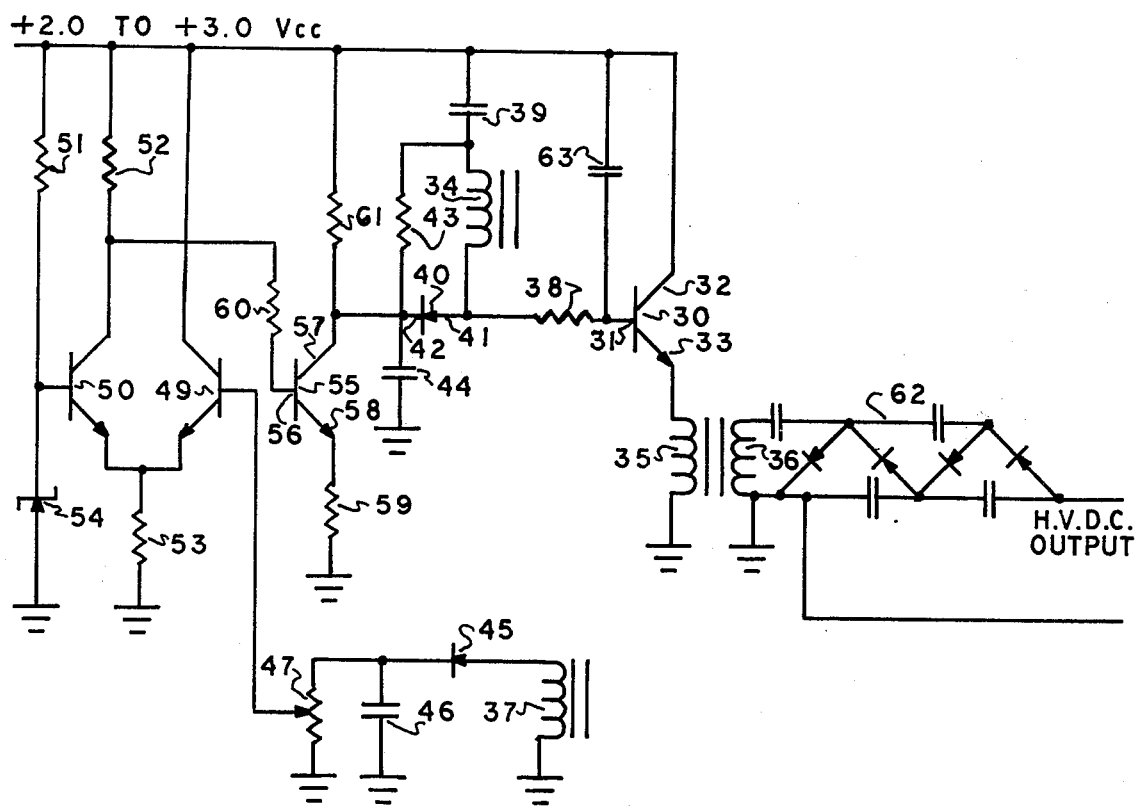
FIG. 2 is a detailed schematic circuit diagram of a regulating system which embodies further aspects of the present invention.

Referring now to FIG. 2, the regulating system thereshown comprises a Hartly derived oscillator comprising transistor 30, a transformer which includes windings 34, 35, 36 and 37, resistor 38, and capacitor 39, clipping means comprising diode 40, resistor 43 and capacitor 44 and a control voltage generating means comprising a rectifier including diode 45, capacitor 46 and variable resistor 47, a comparator comprising transistor 49, transistor 50, resistors 51, 52 and 53, and zener diode 54, and an inverting stage comprising transistor 55 and resistors 59, 60 and 61. Also shown in FIG. 2 is a voltage multiplier and rectifier circuit generally designated at 62.

Transistor 30 is of an NPN type and includes base 31, collector 32 and emitter 33. Collector 32 is coupled to the DC supply voltage, and emitter 33 is coupled to ground through transformer winding 35. Transformer winding 34 is coupled to base 31 of transistor 30 via resistor 38 and to the supply voltage via capacitor 39. As in the oscillator of FIG. 1, windings 34 and 35 are designed to assure oscillation. In particular, the frequency of oscillation is determined by the capacitive component of multiplier and rectifier 62, the inductance of windings 34 and 35, and stray capacitances. Emitter 33 of the oscillator transistor 30 provides the alternating output voltage which is essentially sinusoidal.

Diode 40 of the clipping means includes an anode 41 and a cathode 42. Anode 41 is coupled to the base 31 of transistor 30 via resistor 38 and cathode 42 is coupled to the voltage generating means at collector 57 of transistor 55. Cathode 42 is also coupled to ground via capacitor 44. Resistor 43 of the clipping means is coupled from the cathode 42 of diode 40 to the junction of capacitor 39 and winding 34.

Winding 37 is inductively coupled to winding 35 and receives and senses the peak amplitude of the alternating output voltage of the oscillator. Winding 37 is wound relative to winding 35 such that a first alternating intermediate control voltage which is proportional to the peak amplitude of the alternating output voltage of the oscillator at emitter 33 is induced across its windings. Diode 45 coupled to winding 37 receives the first intermediate alternating control voltage from winding 37 and rectifies it. Capacitor 46 filters the rectified first alternating control voltage and variable resistor 47 taps off a portion of it to thereby provide a first intermediate control voltage.

Transistors 49 and 50 are coupled together in a differential pair configuration and comprise a comparator circuit. Zener diode 54 provides a reference voltage for transistor 50 which is used in comparing the first intermediate control voltage developed at variable resistor 47 for deriving the control voltage.

The comparator comprising transistors 49 and 50 provides a second intermediate control voltage in response to the comparison between the reference voltage provided by the zener diode 54 and the first intermediate control voltage provided at variable resistor 47.

The second intermediate control voltage which is also directly related to the peak amplitude of the oscillator output voltage is impressed upon base 56 of transistor 55 which is coupled to the collector of transistor 50 through resistor 60. Transistor 55 inverts the second intermediate control voltage and provides at collector 57 the control voltage which is inversely related to the peak amplitude of the oscillator output voltage and which is coupled to the clipping means diode 40.

In operation, an increase in the peak amplitude of the alternating output voltage of the oscillator due to a decrease in output load on the oscillator or an increase in the supply voltage will cause a corresponding reduction in the control voltage developed at collector 57 of transistor 55 because the control voltage is inversely related to the peak amplitude of the alternating output voltage of the oscillator. Because the clipping means comprising diode 40 controls the bias of base 31 of transistor 33 in direct relation to the control voltage, the output of the oscillator at emitter 33 will correspondingly be reduced to thereby reduce the oscillator output to the proper level. Should the load on the oscillator increase to cause a decrease in oscillator output, the reverse obtains. That is, a decrease in oscillator output will cause a corresponding increase in the control voltage which will thereupon cause the clipping means diode 40 to conduct less of the time to cause transistor 30 to produce at emitter 33 an increased output voltage to thereagain cause the output voltage to seek the proper level.

Capacitor 44 by being coupled from the cathode 42 of diode 44 to ground insures that a low dynamic impedance is present to provide the required current pulses through clipping diode 40. Also, resistor 43 is returned to the control voltage at cathode 42 instead of the supply voltage. This reduces the bias current for the oscillator while still providing adequate current for fast start-up under load conditions. Resistor 38 and capacitor 63 provide parasitic suppression and are not directly required for regulation control.

From the foregoing, it can be understood that the regulation system of FIG. 2 by including the amplitude control described in reference to FIG. 1, incorporates all of the features and advantages thereof. In particular, the regulation system of FIG. 2 has substantially improved stability over regulation systems of the prior art for wide operating temperature variations because of the balancing out of the conduction characteristics of transistor 30 by the conduction characteristics of diode 40. Additionally, because the base of transistor 30 is being controlled by the amplitude control, the surge currents through diode 40 are reduced by a factor of Beta of transistor 30 over the conventional circuits incorporating a series pass transistor coupled between the supply voltage and the collector of the oscillator transistor.

Readily apparent variations of this embodiment may employ PNP transistors with reversed polarities of all voltages. Another variation would include placing the load winding 35 in series with the collector 32 of transistor 30 instead of the emitter 33.

While particular embodiments of the present invention have been shown and described, modifications may be made, and it is intended in the appended claims to cover all such modifications as may fall within the true spirit and scope of the invention.

We claim:

1. A regulating system for converting a DC voltage to an alternating voltage of constant peak amplitude comprising:
    an oscillator including a transistor having a base and coupled to the DC voltage for converting the DC voltage to an alternating output voltage;
    control voltage means responsive to the peak amplitude of the alternating output voltage for providing a control voltage having a magnitude which is inversely related to the peak amplitude of the alternating output voltage, said control voltage means comprising a transformer winding inductively coupled to said ocillator for sensing the alternating voltage output and for providing an alternating first intermediate control voltage which is directly proportional in magnitude to the output alternating voltage from which said control voltage is derived; and
    clipping means coupled between said base and said control voltage means for controlling the bias of said transistor to thereby cause said oscillator alternating output voltage to vary in direct relation to said control voltage; whereby,
    when the peak amplitude of the output voltage increases, said control voltage decreases causing said clipping means to bias said transistor for decreased output voltage and when the peak amplitude of the output voltage decreases, said control voltage increases causing said clipping means to bias said transistor for increased output voltage to thereby render the peak amplitude of said oscillator alternating output voltage constant.

2. A regulating system in accordance with claim 1 wherein said control voltage means further comprises a rectifier coupled to said transformer winding for rectifying said alternating first intermediate control voltage and a comparator for comparing said rectified first intermediate control voltage to a reference voltage for producing a second intermediate control voltage which is directly related to the peak amplitude of the alternating output voltage.

3. A regulating system in accordance with claim 2 wherein said comparator comprises a pair of transistors coupled together in a differential pair configuration and a zener diode coupled to a given one of said differential pair transistors for providing said reference voltage and wherein said given one of said differential pair transistors provides said second intermediate control voltage.

4. A regulating system in accordance with claim 3 wherein said control voltage means further comprises an inverting transistor coupled to said given one of said differential pair of transistors for inverting said second intermediate control voltage to thereby provide said control voltage.

5. A regulating system for converting a DC voltage to an alternating voltage of constant peak amplitude notwithstanding changing load conditions comprising:
    an oscillator including an NPN transistor having a base, a collector and an emitter, said collector being coupled to the DC voltage for converting the DC voltage to an alternating output voltage at said emitter;
    control voltage means including a sensing transformer winding inductively coupled to said emitter for deriving a first intermediate control voltage which is directly related to the peak amplitude of said alternating output voltage, a rectifier coupled to said sensing winding for rectifying said first intermediate control voltage, a comparator coupled to said rectifier and including a zener diode for comparing said rectified first intermediate control voltage to a reference voltage for providing a second intermediate control voltage directly related to the peak amplitude of said alternating output voltage, and an inverting transistor coupled to said comparator for providing a control voltage inversely related to the peak amplitude of said alternating output voltage; and
    clipping means comprising a diode having an anode and a cathode, said anode being coupled to said oscillator transistor base and said cathode being coupled to said inverting transistor to thereby control the bias of said oscillator transistor responsive to said control voltage to cause the oscillator peak amplitude to vary in direct relation to said control voltage; whereby,
with said control voltage varying in inverse relation to the output voltage, and with the clipping means controlling the oscillator transistor bias in direct relation to said control voltage, the peak amplitude of the oscillator output voltage is maintained constant notwithstanding changing loading conditions upon said oscillator.

* * * * *